United States Patent [19]

Sekiguchi et al.

[11] Patent Number: 5,376,628
[45] Date of Patent: Dec. 27, 1994

[54] METHOD OF IMPROVING OR PRODUCING OXIDE SUPERCONDUCTOR

[75] Inventors: Atsushi Sekiguchi; Hideo Mito, both of Fuchu, Japan

[73] Assignee: Anelva Corporation, Tokyo, Japan

[21] Appl. No.: 845,820

[22] Filed: Mar. 9, 1992

Related U.S. Application Data

[63] Continuation-in-part of Ser. No. 611,434, Nov. 13, 1990, abandoned, which is a continuation of Ser. No. 373,368, Jun. 29, 1989, abandoned.

[30] Foreign Application Priority Data

Jun. 30, 1988 [JP] Japan .................. 63-163350

[51] Int. Cl.$^5$ .............................................. B05D 3/06
[52] U.S. Cl. ................................. 505/480; 505/730; 505/742; 427/62; 427/535; 427/539
[58] Field of Search ................ 505/1, 730, 742, 480; 427/62, 63, 535, 539

[56] References Cited

U.S. PATENT DOCUMENTS

| | | | |
|---|---|---|---|
| 4,664,747 | 5/1987 | Sekiguchi et al. | 156/643 |
| 4,900,716 | 2/1990 | Fujita et al. | 505/1 |
| 4,929,598 | 5/1990 | Bagley et al. | 505/1 |

FOREIGN PATENT DOCUMENTS 160808  6/1989  Japan .

OTHER PUBLICATIONS

Bagley et al, *Applied Physics Letters*, 51 (8), 24 Aug. 1987, pp. 622–624.
Tamura et al, *Extended Abstracts–High–Temp. Superconductors II*, Apr. 1988, pp. 117–120.
Minomo et al, *Jap. J. of Appl. Phys. Lett.*, vol. 27, No. 3, Mar. 1988, pp. L411–L413.
Minomo, S., et al. "Electron–Cyclotron–Resonance Microwave Plasma Oxidation of $Er_1Ba_2CU_3O_y$ Superconductive Ceramics," Japanese Journal of Applied Physics, vol. 27, No. 3, Mar., 1988 pp. L411–L413.
Landesman, J., et al., "Magnetic and XPS Studies of $YBa_2Cu_3O_7$ Annealed in $O_2$ Plasmas," Topical Conference on Thin Film Processing and Characterization of High–Temperature Superconductors, Anaheim, Calif., Mar. 6, 1987, pp. 389–396.
Greene, L., et al., "Tunneling Attempts in Single–phase $Bi_4Sr_3Ca_3Cu_4O_{16+y}$ and Chemical Doping on the Cu Sites in 90 and 40K Superconductors," Physica C 153–155 (1988) pp. 896–897.
Takagi, et al., "$Ba_2Y_1Cu_3O_{7-y}$ Oxidation by Thermodynamic Nonequilibrium High–temperature (TNH) Plasma," Japanese Journal of Applied Physics, vol. 28, No. 6, Jun. 1989, pp. L952–L954.
Mito, et al., "Characteristics and Application of High Temperature Non Equilibrium Plasma," Vacuum vol. 31, No. 4, Apr. 20, 1988, pp. 271–278.
Eryu, et al., "Energy Beam Irradiation to Oxide Superconductors," Institute of Materials Science, University of Tsukuba, Mar. 28, 1988, p. 102.
Bagley, et al., "Plasma Oxidation of the High $T_c$ Superconducting Perovskites," Appl. Phys. Lett. 51 (8), Aug. 24, 1987, pp. 622–624.
Madakson, et al., "Processing of $La_{1.8}Sr_{0.2}CuO_4$ and $YBa_2Cu_3O_7$ Superconductuing Thin Films by Dual–ion-beam Sputtering," J. Appl. Phys., 63 (6), Mar. 15, 1988, pp. 2046–2053.

*Primary Examiner*—Roy V. King
*Attorney, Agent, or Firm*—Pollock, Vande Sande & Priddy

[57] ABSTRACT

Herein is disclosed a method of improving or producing an oxide superconductor. An oxide superconductor or starting material of oxide superconductor as an object material is irradiated with active oxygen species. The irradiation process is carried out while keeping the object material at a temperature at which the object material is effectively oxidized with the active species. The active oxygen species are formed on the inside or in the peripheral portion of a nonequilibrium or equilibrium, high-temperature plasma.

16 Claims, 10 Drawing Sheets

TETRAGONAL OXIDE SUBSTANCES

FIG. 1(a)

ORTHORHOMBIC OXIDE SUPERCONDUCTING SUBSTANCES

METHOD OF IMPROVING OR PRODUCING OXIDE SUPERCONDUCTOR

This application is a continuation-in-part of application Ser. No. 611,434 filed Nov. 13, 1990, now abandoned, which is a continuation of application Ser. No. 373,368 filed Jun. 29, 1989, now abandoned.

FIELD OF THE INVENTION

The present invention relates to a method of improving an oxide superconductor having inferior superconducting properties because of its low oxygen content, or producing a superior oxide superconductor from a starting material having no superconducting properties. Through efficient oxidation of the inferior superconductor and the non-superconducting material, the present invention method seeks to increase the oxygen content of both to thereby readily and remarkably improve the superconducting properties of the former or readily impart to the latter superior superconducting properties.

BACKGROUND OF THE INVENTION

In the wake of the discovery of oxide superconductors, technological development of such oxide superconductors has recently been progressing at a rapid pace. It is known that the oxygen content of an oxide superconductor generally has great influences on its superconducting properties. In the production of an oxide superconductor, however, an extreme difficulty is encountered in securing a predetermined oxygen content in the resulting superconductor.

For example, a $Ba_2YCu_3O_x$ superconductor, where x (which may be zero) represents the quantitative proportion of oxygen in the composition of the superconductor, is produced by mixing barium carbonate ($BaCO_3$) with yttrium oxide ($Y_2O_3$) and copper oxide (CuO) at a predetermined ratio, compression-molding the resulting mixture into a pellet, and heating the pellet in an oxygen-filled furnace under atmospheric pressure at 930° C.

As is well known, the pellet thus treated is of tetragonal crystal structure at a temperature of 930° C. When this oxide pellet is dipped quickly into liquid nitrogen to be quenched from 930° C., it still maintains the tetragonal crystal structure. However, this pellet cannot show superconductivity because it has a low oxygen content (see, for example, H. Ihara, et al. Physica C 153–155 (1988) 948–949). In the following description, oxide substances incapable of showing superconductivity because of their low oxygen contents will be referred to as "tetragonal structure substances".

In order to increase the oxygen content of the pellet to a suitable value to provide the best superconducting substance, the pellet must usually be slowly cooled from the above-mentioned temperature of 930° C. over one day and night through furnace cooling. The pellet cooled in this manner is of orthorhombic crystal structure and shows superconductivity at temperatures of around 90° K. or lower. In the following description, orthorhombic oxide superconducting substances showing superconductivity at temperatures of around 90° K. or lower will be referred to as "orthorhombic structure substances".

Thus, according to the foregoing conventional method, a pellet must be slowly cooled from 930° C. over one day and night through furnace cooling in order to secure superior superconducting properties. Furnace cooling over such a long period of time is not commercially feasible to industrial producing of superconductors.

B. G. Bagley et al. reported in their paper [Appl. Phys. Lett. 51 (1987) p. 622–p. 624] that a tetragonal structure substance incapable of showing superconductivity was subjected to a radiofrequency discharge treatment in an atmosphere of oxygen to be changed into an orthorhombic structure substance capable of showing superconductivity. In this case, however, plasma oxidation treatment over 285 hours is necessary for securing a 90-K class superconductor which exhibits superconductivity at temperatures of around 90° K. or lower. Plasma oxidation treatment over such a long period of time is industrially impractical as well.

S. Minomo et al reported in their paper (Jpn. J Appl. Phys. 27 (1988) p. L411–L413) that a superconducting substance of 60-K class which shows superconductivity at temperatures of around 60-K or lower was heated to 400° C. and subjected to an ECR (electron cyclotron resonance) discharge treatment at 400° C. for 30 minutes, in order to be changed into an improved superconducting substance having a 90-K class of superconductivity. However, this process is concerned only with discharge and heating treatments of a substance, already capable of showing superconductivity in itself, to improve the superconducting properties thereof. Hence, the Minomo method is different from a treatment of changing the crystal structure of a tetragonal substance into a superconducting crystal structure.

Figure 1A:
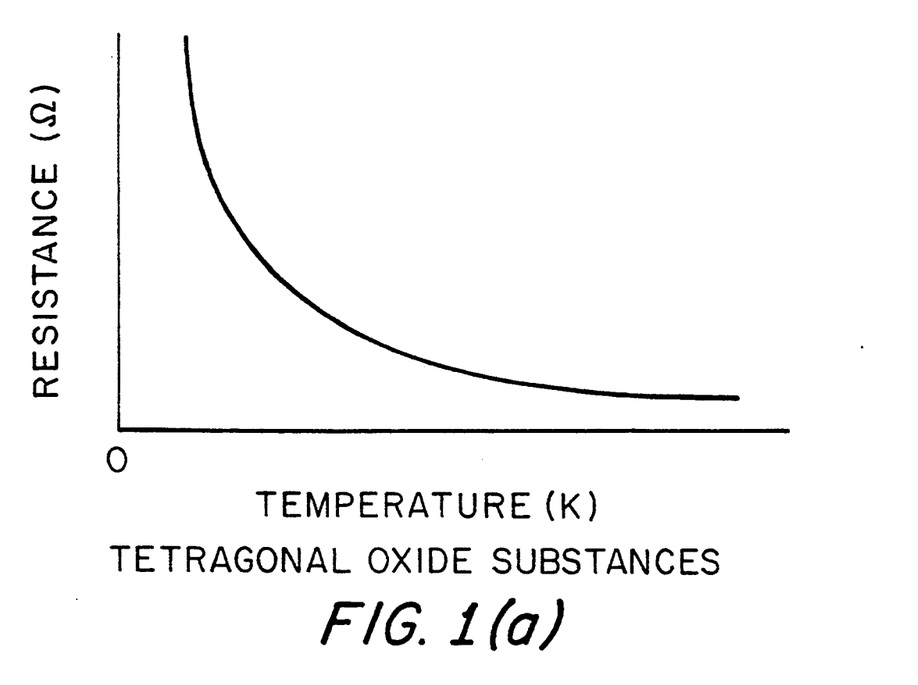
FIGS. 1(a) and 1(b) are diagrams showing the electric resistance versus temperature characteristic curves of tetragonal and orthorhombic structure crystals, which are illustrative of the electrical characteristics thereof.
Figure 1B:
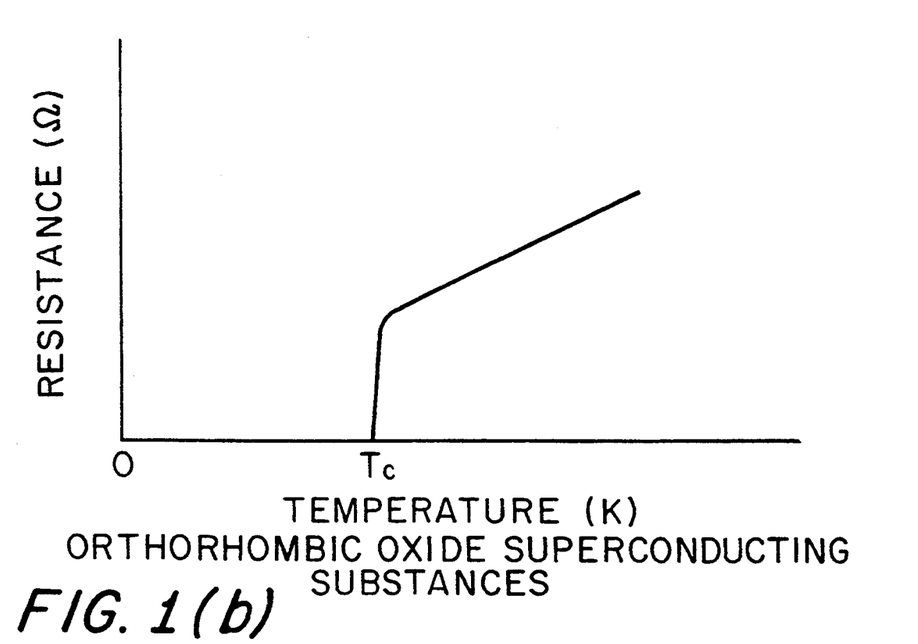

Tetragonal structured oxide substances show semiconductor-like characteristics of electric resistance with the temperature shown in FIG. 1(a), while orthorhombic structured oxide superconducting substances show the characteristics of electric resistance with the temperature shown in FIG. 1(b), which corresponds to the characteristics of superconductors. In FIGS. 1(a) and 1(b), the abscissa represents the temperature (K) on an arbitrary scale, while the ordinate represents the electric resistance ($\Omega$) on an arbitrary scale. The superconductive transition temperature, or critical temperature $T_c$, is a temperature at and below which superconductivity is shown. Therefore, in the case of the superconducting substance reported by S. Minomo et al., it is important to note that "the crystal structure of the substance was not changed." In order to change a tetragonal structure substance into an orthorhombic structure substance having superconducting properties, the former must usually be treated in an atmosphere of oxygen at a high temperature (at 300° C., no change thereof occurs even when it is treated for 2 hours). Further, it has heretofore been impossible to change a tetragonal structure substance quenched from a high temperature into an orthorhombic structure substance having superconducting properties within a short period of time.

Etatsu et al. reported in 1988 35th Oyobutsurigaku -Kanren Koenkai Extended Abstracts (The 35th Spring Meeting, 1988) The Japan Society of Applied Physics and Related Societies 29a-X-5 that a tetragonal structure substance was locally changed into an orthorhombic structure substance through oxygen ion implantation and laser annealing. However, this procedure is an extremely local treatment which is, therefore, inapplicable to large scale production of broad-area superconductors.

As described above, in order to change a tetragonal structure substance into an orthorhombic structure substance having good superconducting properties, the tetragonal structure substance must be treated in an atmosphere of oxygen in a furnace at a temperature higher than at least 400° C. for a long period of time, or must be treated in an oxygen plasma for a period of time longer than at least 200 hours. Thus, all the foregoing conventional methods involving an annealing-in-oxygen ($O_2$) treatment under atmospheric pressure requiring a long treatment time posed a problem of inadaptability to large scale production of superconductors.

Further, through the aforementioned ECR discharge treatment method is capable of improving the superconducting properties of an orthorhombic structure substance, it is incapable of changing a tetragonal structure substance into an orthorhombic structure substance.

SUMMARY OF THE INVENTION

In view of the foregoing problems of the prior art, an object of the present invention is to provide an improvement-by-oxidation method which can change a tetragonal structure substance produced through quenching from a high temperature instead of slow cooling, or an orthorhombic structure substance having inferior superconducting properties into a substance having superior superconducting properties by an oxidation treatment for a shorter period of time than that required by the conventional annealing-in-oxygen treatment under atmospheric pressure.

In accordance with the present invention, the above-mentioned object can be attained by providing a method of improving or producing an oxide superconductor which comprises irradiating an oxide superconductor or a starting material of oxide superconductor as an object material with active oxygen species formed on the inside of or in the peripheral portion of a nonequilibrium or equilibrium, high-temperature plasma, while keeping said object material at a temperature at which said object material is effectively oxidized with said active oxygen species.

A nonequilibrium or equilibrium high-temperature plasma produces therein a large quantity of atomic active species, which are high in diffusion coefficient for diffusing into a solid and are in the nature of quickly diffusing into a solid even at low temperatures. When an oxide superconductor or a starting material of oxide superconductor as an object substance in the form of a pellet is irradiated with such active oxygen species, the active oxygen species diffuse into the superconductor or the starting material of superconductor to supplement the deficiency of oxygen therein to thereby sufficiently increase the oxygen content thereof, whereby the superconductor can improved in superconducting properties while the starting material of superconductor can be changed into a superconductor having superior superconducting properties.

Therefore, according to the method of the present invention, slow cooling of a pellet, which is effected according to the aforementioned conventional method, is unnecessary after irradiation thereof with active oxygen species produced by a nonequilibrium or equilibrium, high-temperature plasma because the pellet can be effectively oxidized in a short time at a low temperature during the course of the irradiation thereof with the active oxygen species to secure superior superconducting properties. An object to be oxidized with active oxygen species at a low temperature may be a pellet of a tetragonal structure substance prepared through quenching.

The novel effective method of the present invention has been developed by utilizing the basics of "Surface Processing Apparatus Utilizing Local Thermal Equilibrium Plasma And Method of Using Same," disclosed in U.S. Pat. No. 4,664,747 issued to the applicants of the instant application, in the step of oxidation of an oxide superconductor which was not publicly known at the priority date of the above-mentioned U.S. Patent.

A description will now be made of a nonequilibrium high-temperature plasma and an equilibrium high-temperature plasma. As an RF power supplied to a coil is increased, radiofrequency glow discharge occurs first. When the RF power is further increased, the luminance of a plasma is greatly increased and a thermodynamic nonequilibrium high-temperature (TNH) plasma or a thermodynamic equilibrium high-temperature (TEH) plasma (referred to in brief as a "TNH plasma" and a "TEH plasma," respectively) can be observed. In general, such a nonequilibrium high-temperature plasma and an equilibrium high-temperature plasma are characterized by a very high optical emission intensity, formation of a large quantity of active species particularly including a large quantity of atomic active species, and a low discharge impedance in electrical terms, as compared with radiofrequency glow discharge. The detailed description of the nonequilibrium high-temperature plasma and the equilibrium high-temperature plasma is dispensed with here because it is made in Hideo Mito et al., "Shinku," Vol. 31, No. 4 (1988) p. 271–p. 278, and pieces of literature cited therein.

For the instant invention, a TNH plasma is provided to an rf coil electrode, which causes plasma emissions from the TNH plasma to occur essentially inside the space surrounded by the rf coil electrode. The phenomenon of plasma emissions being substantially confined within the space surrounded by the rf coil electrode is recognized by the inventors to be due to a so-called "pinch-effect". In addition to being confined essentially within the space surrounded by the rf coil electrode, the plasma used in the present invention has the further characteristic that the intensity of the plasma emission of oxygen (O) atoms therefrom, at 777 nm, is approximately 100 times stronger than the strongest intensity of plasma emissions within the visible spectrum of oxygen ($O_2^+$) molecules.

BRIEF DESCRIPTION OF THE DRAWINGS

The foregoing and other features and advantages of the present invention will be better understood by reference to the following description, taken in connection with the accompanying drawings, in which:

FIGS. 3(a), 3(b) and 3(c) are diagrams showing the results of X-ray diffractometric analyses of an object not treated and objects treated according to the method of the present invention, of which FIG. 3(a) is of the object not treated, FIG. 3(b) is of an object treated at 300° C. for 1 minute, and FIG. 3(c) is of an object treated at 300° C. for 5 minutes;

FIGS. 4(a) 4(b) and 4(c) are diagrams showing the electric resistance versus temperature characteristic curves of an object not treated and objects treated according to the method of the present invention, of which FIG. 4(a) is of the object not treated, FIG. 4(b) is of an object treated at 300° C. for 30 minutes, and FIG. 4(c) is of an object treated at 400° C. for 30 minutes.

DETAILED DESCRIPTION OF THE INVENTION

Preferred examples of the method of the present invention will now be described while referring to accompanying drawings.

Figure 2:
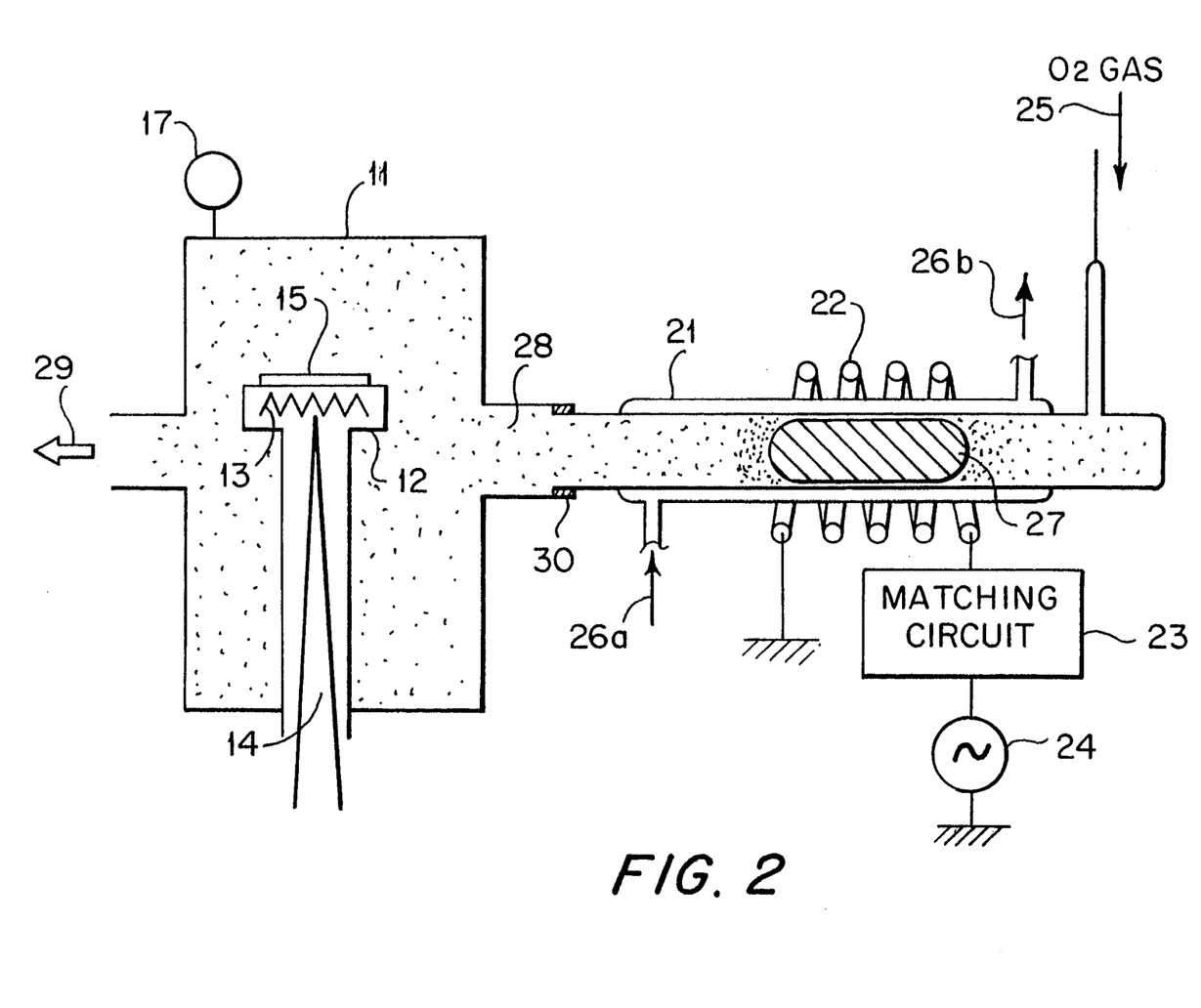
FIG. 2 is a front cross-sectional view of an apparatus for carrying out the method of the present invention.

FIG. 2 shows a front sectional view of an apparatus with which the method of the present invention is carried out. Additionally stated, FIG. 2 is schematic to such an extent to merely facilitate the understanding of the present invention. Therefore, the shapes and sizes of constituent parts as well as the positional relationships therebetween should not be construed as being limited to those drawn in FIG. 2.

A stainless steel processing chamber 11 is of a structure capable of being evacuated to a high degree of vacuum and kept in a hermetically close state as desired. An object holder 12 is capable of holding an object 15 to be treated, for example, for an improvement in the superconducting properties thereof and of controlling the temperature of the object 15, and is provided with a heater 13 and a thermocouple 14. The object holder 12 has a diameter of 10 cm and is capable of being heated from about 0° C. up to about 450° C. The temperature of the object holder 12 is measured by means of the thermocouple 14 and is controlled by supplying an electric power to the heater 13 through on-off control using a simple relay or through P, P+I or P+I+D control using a temperature control system not shown in FIG. 2 in combination with a thyristor unit also not shown in FIG. 2, wherein P stands for the proportional, I stands for the integral and D stands for the differential. If necessary, a water-cooling or other cooling mechanism is used in combination with the foregoing temperature control means.

A discharge tube 21 is a double tube made of quartz glass and having a structure capable of passing water between two tubular parts. In this example, the quartz glass tube is 3 cm in innermost diameter and 53 cm in length. The direction of inflow of cooling water is designated by a 26a, while the direction of outflow thereof is designated by 26b.

A coil 22 is made of a copper pipe, which is cooled by passing cooling water therethrough. One end of the coil 22 is grounded, while the other end thereof is connected with a radiofrequency power source 24 via a matching circuit 23. In this example, the radiofrequency power source 24 was 13.56 MHz in frequency and 5 kW in output.

In this example, oxygen was used as a gas for forming active species of oxygen. The oxygen gas is fed in the direction of arrow 25 through a pressure reducing valve and a flow rate controller, neither being shown in FIG. 2, from an oxygen cylinder, also not shown in FIG. 2, and is exhausted in the direction of arrow 29. A Root's pump and an oil-sealed rotary vacuum, neither being shown in FIG. 2, are used for exhausting the gas.

The stainless steel process chamber 11 is kept apart from the discharge tube 21 with a rubber O-ring 30 serving to connect them with each other. Such detachment of the process chamber 11 from the discharge tube 21 is to keep a plasma apart from an object 15 to thereby prevent the object 15 from being destroyed by the plasma itself and keep the RF coil 22 from heating the object 15 to avoid any adverse influences on the improvement in the superconducting properties thereof. The pressure inside the process chamber 11 is measured by a pressure gauge 17 and controlled to be constant through control of the conductance of valve installed in front of arrow 29 but not shown in FIG. 2.

As described in U.S. Pat. No. 4,664,747, when electric power is supplied from the radiofrequency power source 24 to the coil 22, there initially occurs a radiofrequency glow discharge broadly spread across the discharge tube 21. When greater electric power is further supplied to the coil 22, there is generated a nonequilibrium or equilibrium, high-temperature plasma 27 pinched locally in a space surrounded by the coil 22. Plasma 27 thus may also be referred to as locally pinched plasma.

Active oxygen species 28 are formed by the nonequilibrium or equilibrium, high-temperature plasma locally pinched 27. Depending on the pressure (often when the pressure is as low as at most about 10 Torr), the active species 28 may also include active oxygen species formed by a glow discharge plasma, which is observed around the nonequilibrium or equilibrium, high-temperature plasma 27.

However, the inventors have found, via the experiments detailed hereinbelow, that when a glow-discharge plasma is used, the emission spectrum of oxygen ($O_2^+$) molecules in the visible spectrum range of 400 nm to 800 nm tends to have a number of peaks. The intensity of the emission spectrum of the strongest of the peaks may be denoted by $I(O_2^+)$. Furthermore, the inventors found that an emission spectrum of oxygen (O) atom, at 777 nm-wavelength (according to "Atomic Transition Probabilities", by W. L. Wiese, et al , National Standard Reference Data Series Vol. 1 Hydrogen Through Neon, Published May 20, 1966 by U.S. Department of Commerce, National Bureau of Standards in higher resolution, three peaks have been found at 777.196 nm, 777,418 nm and 777.540 nm-wavelengths) is also produced in a glow-discharge plasma. The intensity of the emission spectrum of O atom at 777 nm may be designated as $I(0.777)$. The value of the ratio between $I(0.777)$ and $I(O_2^+)$, i.e. $I(0.777)/I(O_2^+)$, is found to be approximately 25.1.

With a non-equilibrium or equilibrium, high-temperature plasma, such as for example a TNH plasma, being used, due to the pinch-effect (such pinch-effect, which is applicable to TNH plasma, is known in the literature, as for example in "An Introduction to Plasma Physics", by W. B. Thompson, published by Pergamon Press Ltd., 2nd Edition, 1967, at pages 37 to 42), the intensity of the emission spectrum of O atoms at 777 nm-wavelength is found to be very strong. The inventors found that such strong intensity of the emission spectrum of O atoms tends to dwarf the intensity of the emission spectrum of the $O_2^+$ molecules such that the latter intensity tends to be negligible. In particular, the inventors found that the intensity of the emission spectrum of O atoms, at 777 nm, is approximately 100 times stronger than the strongest emission intensity within the visible spectrum of $O_2^+$ molecules.

In the experiments, the inventors observed two types of emission spectra from a plasma of $O_2$ gas.

The first type of observed emission spectrum was determined to be caused by the energy transition of oxygen (O) atoms which effects an emission spectrum at 777 nm-wavelength. This spectrum corresponds to light emission due to energy transition from an energy state of $3p^5P$ to one of $3s^5S^0$.

The second type of observed emission spectrum was determined to result from oxygen ($O_2^+$) molecules and can be observed in the visible spectrum range of from 400 nm to 800 nm. Such $O_2^+$ emission spectrum has a broader distribution in its intensity because transitions of the same, and/or nearly the same, energy are caused by the oscillation and/or rotation of the molecules.

Figure 9:
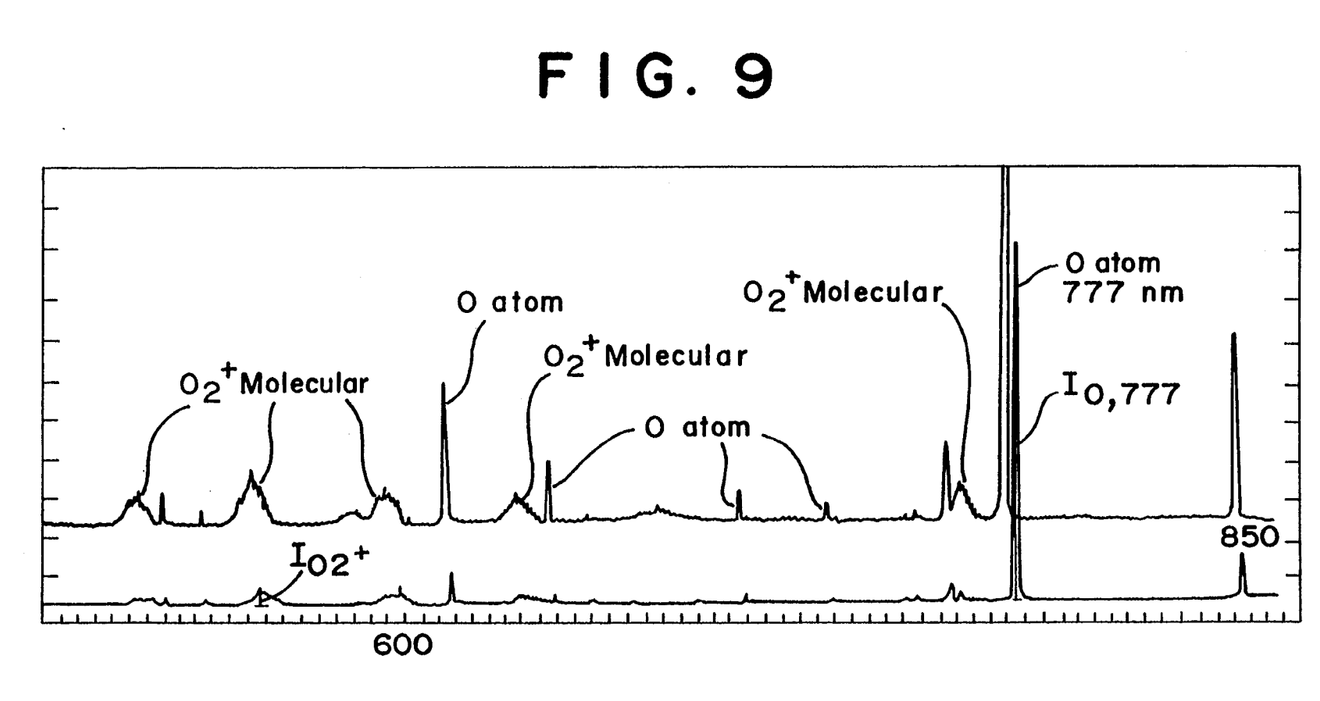
FIG. 9 is a graph representation of a chart record showing emission spectra from a plasma of oxygen gas.

Such $O_2^+$ emission spectrum is shown in FIG. 9. Specifically, FIG. 9 is a graph (not drawn to scale) of experimental data that shows an emission spectrum of a glow-discharge plasma obtained under the following conditions:

Gas: $O_2$;
Pressures: 0.7 Torr;
Input power: 500 W
Flow rate: 200 sccm.

As shown, there are five peaks of the $O_2^+$ emission spectrum in the visible spectrum range of 400 nm–800 nm. The strongest peak is the one immediately to the right of the leftmost peak. The emission intensity of the strongest peak is denoted by $I(O_2^+)$ and that of the O atom at 777 nm by $I(0.777)$. By using the actual scaled outputs of the record chart to which FIG. 9 is derived, the height of the intensity of the emission spectrum of $I(O_2^+)$ is measured to be approximately 8 mm and that of $I(0.777)$ approximately 201 mm. Thus, the value of the ratio of $I(0.777)/I(O_2^+)$ was calculated to be approximately 25.12.

Figure 10:
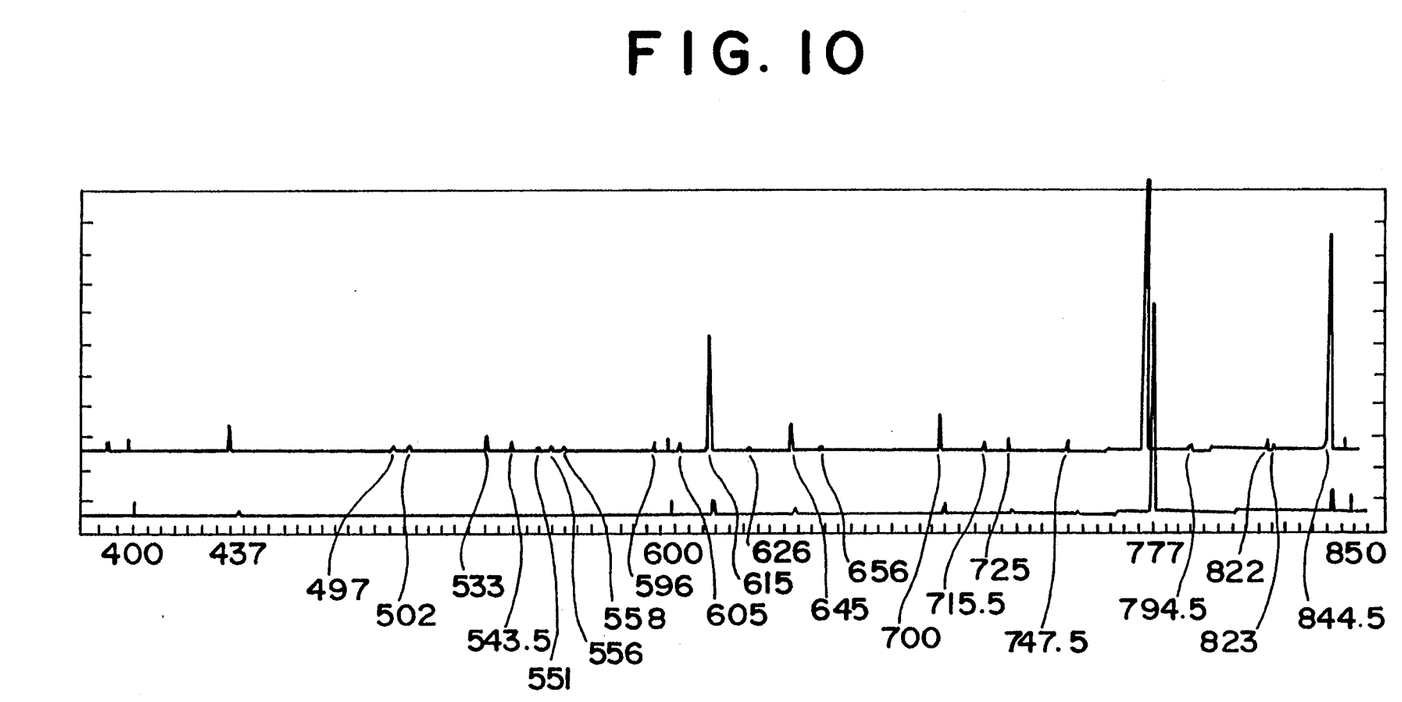
FIG. 10 is a graph representation of a chart record showing the emission spectra from a TNH plasma.

FIG. 10 shows the experimental data of the emission spectrum caused by TNH plasma performed under the following conditions:

Gas: $O_2$;
Pressure: 0.7 Torr;
Input power: 5 kw;
Flow rate: 200 sccm.

The plasma used in the instant invention may be equated with such TNH plasma. As illustrated in FIG. 10 (which also is not drawn to scale), no $O_2^+$ emission spectrum is to be found in the visual spectrum range. However, the intensity of the emission spectrum for O atoms at 777 nm is shown to be very strong. From experience, by studying the actual chart record from which FIG. 10 is derived, the inventors recognized that the intensity of the emission spectrum of O atoms at 777 nm is approximately, at least, 100 times stronger than that of $O_2^+$ molecules, whose emission spectrum intensity cannot even be observed from FIG. 10.

The ratio value of the respective emission spectrum intensities $I(0.777)/I(O_2^+)$ of O atoms and $O_2^+$ molecules obtained from the TNH plasma (i.e. $\approx 100$) thus is quite different from the ratio value of the same obtained from the glow-discharge plasma (i.e. $\approx 25.12$). The inventors accordingly concluded that an emission spectrum from a glow-discharge plasma is not the same as, and cannot be compared with, an emission spectrum from a TNH plasma.

Based on the above observations, the inventors decided to define the TNH plasma used in their experiments as a plasma whose emission intensity $I(0.777)$ of O atoms at 777 nm is approximately, at least, 100 times stronger than the strongest emission spectrum intensity $I(O_2^+)$ of $O_2^+$ molecules within the visible spectrum range.

Moreover, prior to the instant invention, it has been generally assumed that when inputting power to a plasma, the emission spectrum intensity of $O_2^+$ molecules and that of O atoms at 777 nm would become stronger in proportion to the amount of increase of the input power. It follows then that it would also seem to be obvious that the emission spectrum intensity ratio of $O_2^+$ molecules to O atoms would stay proportionally constant even if the input power were to increase while being provided to a TNH plasma. Yet the graph of the data reflecting the experiments performed by the inventors in FIG. 10 shows the opposite to the above expectation. To wit, FIG. 10 shows the emission spectrum intensity of O atoms to be much stronger at the expense of the emission spectrum intensity of $O_2^+$ molecules. In other words, according to the data shown in FIG. 10, the emission spectrum intensity of $O_2^+$ molecules becomes weaker and negligible, when compared to the emission spectrum intensity of O atoms.

Thus, the above finding by the inventors is contrary to the popular belief that the respective emission intensities of $O_2^+$ molecules and O atoms at 777 nm will become stronger in proportion to the amount of power being input to a plasma, and the resulting obvious expectation that the ratio value of the emission intensity of $O_2^+$ molecules to O atoms would stay proportionally constant even were power provided to a TNH plasma to be increased. To the inventors, such unanticipated result meant that many more O atoms were generated when power is provided to the TNH plasma, which was not the case when power was provided to a glow-discharge plasma, where it was well known that the ratio of respective emission spectrum intensities of O atoms and $O_2^+$ molecules would remain proportionally constant even when power provided thereto were to vary.

In using TNH plasma, the inventors further found that if the TNH plasma is provided to an rf coil electrode, the plasma emissions from the TNH plasma would occur essentially inside the space surrounded by the rf coil electrode, i.e. the plasma is locally pinched. The inventors recognized such phenomenon to be caused by the aforenoted "pinch-effect".

Accordingly, for the present invention embodiment as exemplified in FIG. 2, the plasma used therein is defined to have the following two characteristics:

(a) its plasma emission is confined essentially in a space surrounded by an electrode (due to punch-effect); and (b) the plasma emission of O atoms for the plasma of the present invention has an intensity, at 777 nm, of approximately 100 times stronger than the strongest emission intensity within the visible spectrum of $O_2^+$ molecules.

The life span of the active species 28 during transportation thereof to the process chamber 11 is detailed in the paper of J. M. Cook, "Solid State Technology," Japanese edition, May (1987) p. 28–p. 33 and in pieces of literature cited therein, in which the life span, downstream, of oxygen atoms formed by microwave discharge is discussed. The conclusion from the literature is that 90% or more of oxygen atoms are active 50 cm downstream of a plasma. But the literature lacks discussion about application of such oxygen atoms to superconducting materials.

In this example, tetragonal structured $Ba_2YCu_3O_x$ pellets of 1 cm in diameter and 2 mm in thickness which were prepared through quenching from 930° C., instead of furnace cooling, were used as objects 15. Each object 15 of tetragonal structure having no superconducting properties was mounted on the object holder 12 in the apparatus as shown in FIG. 2, which was then placed under conditions including an oxygen flow rate of 200 sccm, a pressure inside the process chamber 11 of 0.7 Torr, and an electric power of 3 kW. The temperature of the object holder 12 is preferably set within the range of 0° to 450° C. because the oxidative effect of active species inside the object is significant at a temperature of 450° C. or lower and the time necessary for oxidation of the object is within the practical range at a temperature of 0° C. or higher. In view of this, in this experiment, the temperature of the object holder 12 was set as low as 300° C. or 400° C. during the treatment. In this experiment, a nonequilibrium high-temperature plasma was generated to form active species, which were effectively supplied into the object 15.

Figure 3A:
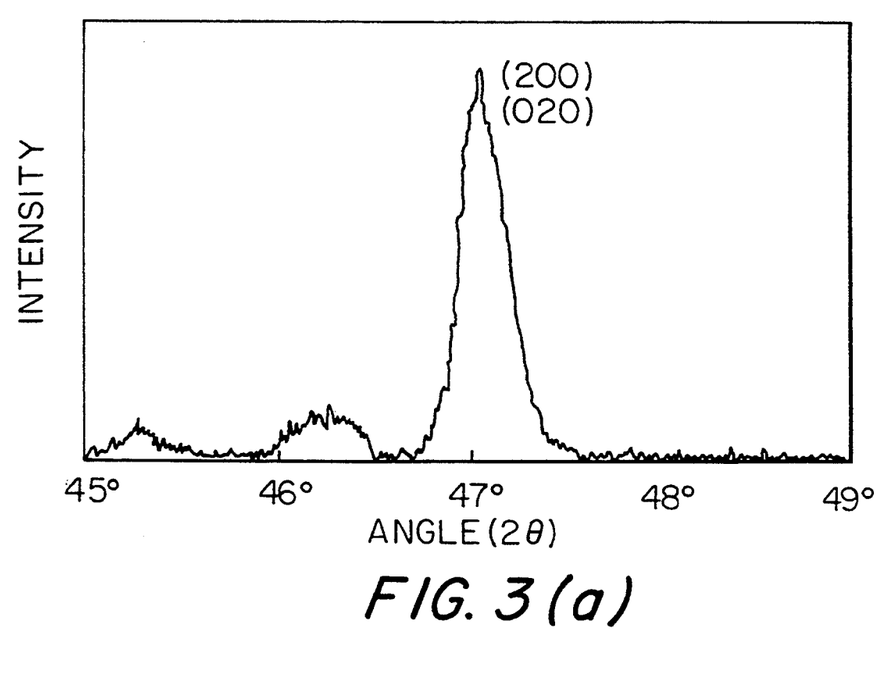
Figure 3B:
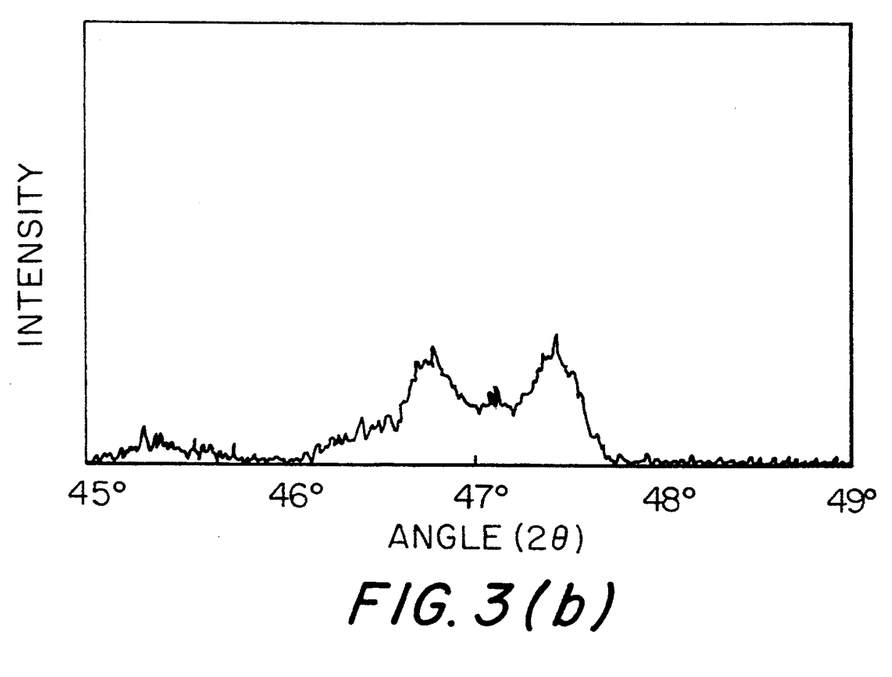
Figure 3C:
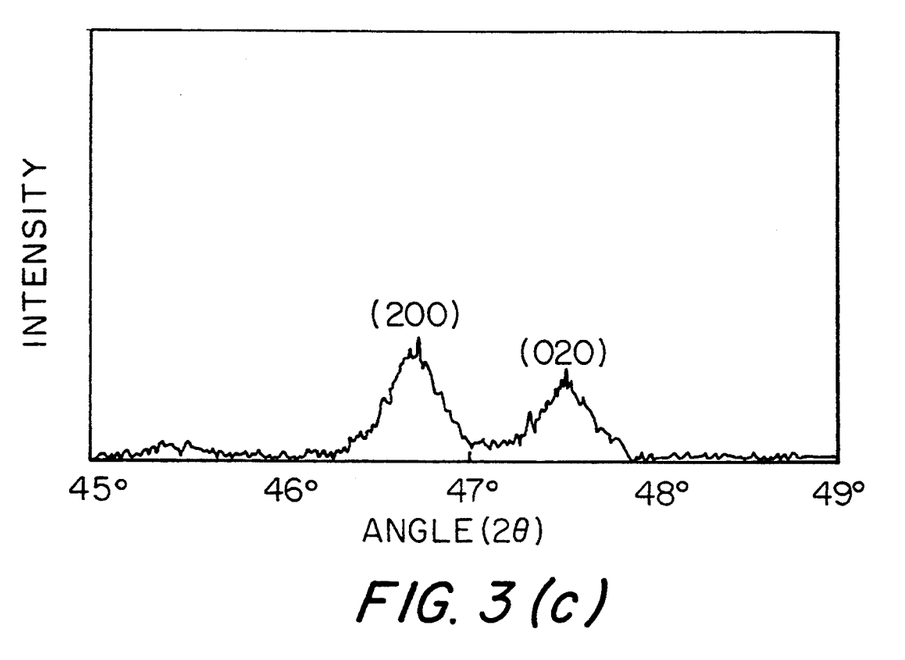

FIGS. 3(a), 3(b) and 3(c) show the results of X-ray diffractometric analyses of a pellet not treated and pellet treated under the foregoing conditions.

FIG. 3(a) is the X-ray diffraction pattern of the pellet not treated, while FIGS. 3(b) and 3(c) are the X-ray diffraction patterns of the pellets treated at 300° C. for 1 minute and 5 minutes, respectively. The abscissa of each figure represents the angle, while the ordinate of each figure represents the intensity (relative value) of X-ray reflected from each pellet.

The X-ray diffraction patterns of $Ba_2YCu_3O_x$ superconductors are well known. Tetragonal structure $Ba_2YCu_3O_x$ and orthorhombic structure $Ba_2YCu_3O_x$ having superconducting properties as well as the relationship between the oxygen content of $Ba_2YCu_3O_x$ crystals and the superconducting properties thereof are detailed in the paper of Nakanishi et al., "Jpn. J. Appl. Phys.," 27, (1988) p. L329–p. L332, the paper of Y. Kubo et al., "Jpn. J. Appl . Phys.," 26, (1987) p. L768–p. L770, and pieces of literature cited therein. As is well known, X-ray diffractometry provides a reflection intensity pattern with peaks at angles in accordance with the lattice constants of a-, b- and c-axes of a crystal. In the case of tetragonal crystals, since the lattice constant of a-axis is equal to that of b-axis, reflection peaks respectively assigned to the (200) plane and (020) plane appear in the form of one strong reflection peak at the same angle in an X-ray diffraction pattern as shown in FIG. 3(a). In the case of orthorhombic crystals, since the lattice constant of a-axis is different from that of b-axis, peaks respectively assigned to the (200) plane and (020) plane appear at different angles in an X-ray diffraction pattern as shown in FIG. 3(c). The X-ray diffraction pattern shown in FIG. 3(b) is a combination of the patterns of tetragonal and orthorhombic crystals.

The X-ray diffraction pattern of FIG. 3(a) is a typical pattern of tetragonal crystals which does not represent a crystal structure capable of showing superconductivity as will be described later.

The X-ray diffraction pattern of FIG. 3(b), which is of the pellet treated using a nonequilibrium high-temperature plasma at 300° C. for 1 minute, represents a mixed crystal structure of the tetragonal and the orthorhombic type.

The X-ray diffraction pattern of FIG. 3(c), which is of the pellet treated using a nonequilibrium high-temperature plasma at 300° C. for 5 minutes, represents a typical crystal structure of the orthorhombic type. This means that the tetragonal crystal structure substance can be changed within a period of time as short as 5 minutes at a temperature as low as 300° C. according to the method of the present invention to provide an orthorhombic structured substance having superconducting properties.

Figure 4:
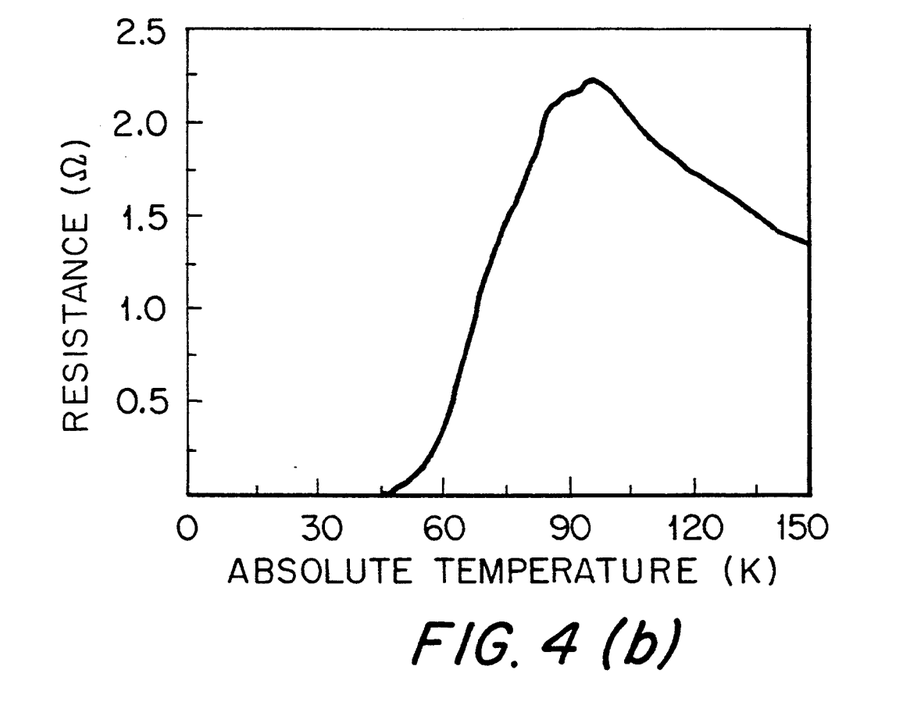
Figure 4A:
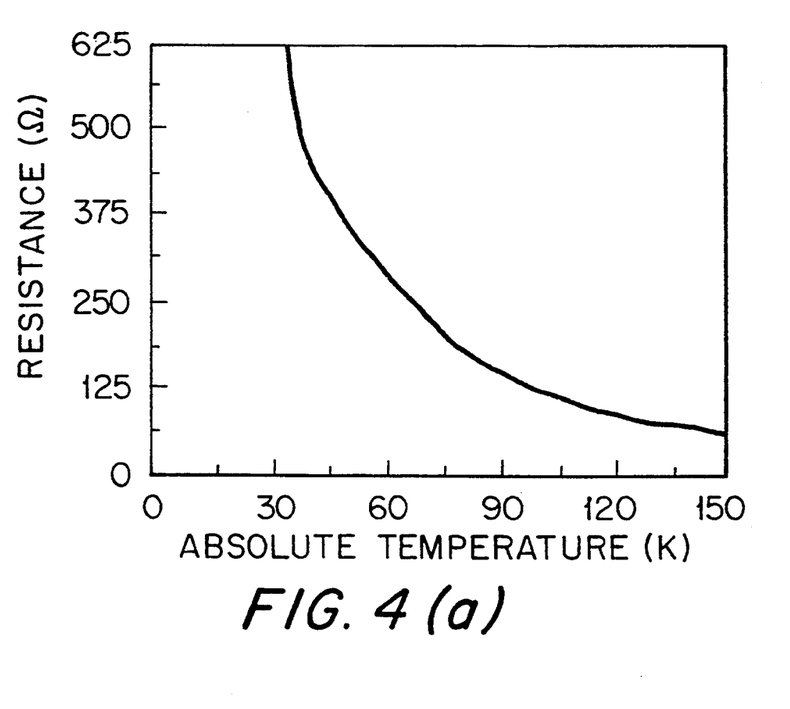

FIGS. 4(a), 4(b) and 4(c) show the electric resistance versus temperature characteristic curves of pellets prepared in the same manner as described before and treated or not treated. In each of FIGS. 4(a), 4(b) and 4(c), the abscissa represents the absolute temperature (K), while the ordinate represents the electric resistance ($\Omega$).

FIG. 4(a) is of a pellet not treated, while FIG. 4(b) is of a pellet treated at 300° C. for 30 minutes and FIG. 4(c) is of a pellet treated at 400° C. for 30 minutes.

The pattern of FIG. 4(a) represents the characteristics of semiconductor, which is of tetragonal crystal structure and has no superconducting properties.

As is well known, superconductivity equals an electric resistance of zero. Accordingly, the pattern of FIG. 4(a) represents no superconducting properties, while the patterns of FIGS. 4(b) and 4(c) represent such superconducting properties as to include the superconductive transition temperatures of about 50° K. and about 85° K., respectively. FIG. 4(c) in particular shows superior superconducting properties substantially comparable to the 90-K class of superconductivity. It has been confirmed that the pellets corresponding to FIGS. 4(b) and 4(c) show diamagnetism at the liquid nitrogen temperature (77° K.).

As described above, according to the method of the present invention, a tetragonal structure substance having no superconducting properties can be changed into an orthorhombic structure substance having superconducting properties through a treatment at a temperature as low as 300° C. or 400° C. in a very short period of time as compared with that necessary for the conventional annealing-in-oxygen treatment under atmospheric pressure, and the superconducting properties of the orthorhombic structure substance can be further enhanced to a high level of the 90-K class of superconductivity. Although the experiments of the foregoing example were carried out with the object holder being kept at a temperature of 300° C. or 400° C., the effect of the present invention can be expected to be satisfactorily exhibited at any temperature of the object holder falling within the range of 0° C. to 450° C..

Further, an object having inferior superconducting properties (an object which shows superconductivity at lower temperatures) can exhibit superconductivity at higher temperatures when treated according to the method of the present invention.

While treatments were carried out under a vacuum pressure of 0.7 Torr in the foregoing example, the effect of the present invention is not lost by a treatment using a nonequilibrium or equilibrium, high-temperature plasma which is carried out even under a pressure equal to or higher than atmospheric pressure. In this case, a nonequilibrium plasma sometimes changes into an equilibrium plasma.

While the bulk pellets were used in the foregoing example, the method of the present invention can be expected to be effective not only for thin and thick film formed by sputtering, vacuum evaporation and deposition, or the like, but also for powders.

Further, the method of the present invention may be adaptable in a film oxidation treatment carried out simultaneously with superconducting film formation by a CVD method to secure a remarkable effect as demonstrated above.

During film formation by vacuum evaporation and deposition, MBE or the like, a film being formed can be oxidized while exhausting a gas.

In addition to $Ba_2YCu_3O_x$, superconductors and starting materials thereof for which the method of the present invention is expected to be effective include those analogous to $Ba_2YCu_3O_x$ but containing a lanthanoide element (Ln) instead of Y and are hence represented by the formula:

$LnBa_2Cu_3O_x$, wherein Ln is La, Ce, Pr, Nd, Pm, Sm, Eu, Gd, Tb, Dy, Ho, Tm, Yb, or Lu;

those containing the same elements as in either of the above-mentioned two formulas but in amounts stoichiometrically different from the amounts in the above-mentioned formulas; those of Bi or Tl type represented by either of the following two formulae:

$Bi_2Ca_2Sr_2Cu_3O_x$, and $Tl_2Ba_2Ca_2Cu_3O_x$;

those containing the same elements as in either of the two formulae just mentioned above but in amounts stoichiometrically different from the amounts in the formulae just mentioned above; and others with various elemental and stoichiometrical compositions.

The apparatus for carrying out the method of the present invention is not limited to the structure as shown in FIG. 2. Usable apparatuses for carrying out the method of the present invention to secure the same effect as demonstrated hereinbefore includes various structures as disclosed in U.S. Pat. No. 4,664,747, and those disclosed in the paper by the authors of the present invention, "Shinku," Vol. 31, No. 4 (1988). p 271–p. 278 and the references cited therein.

Figure 5:
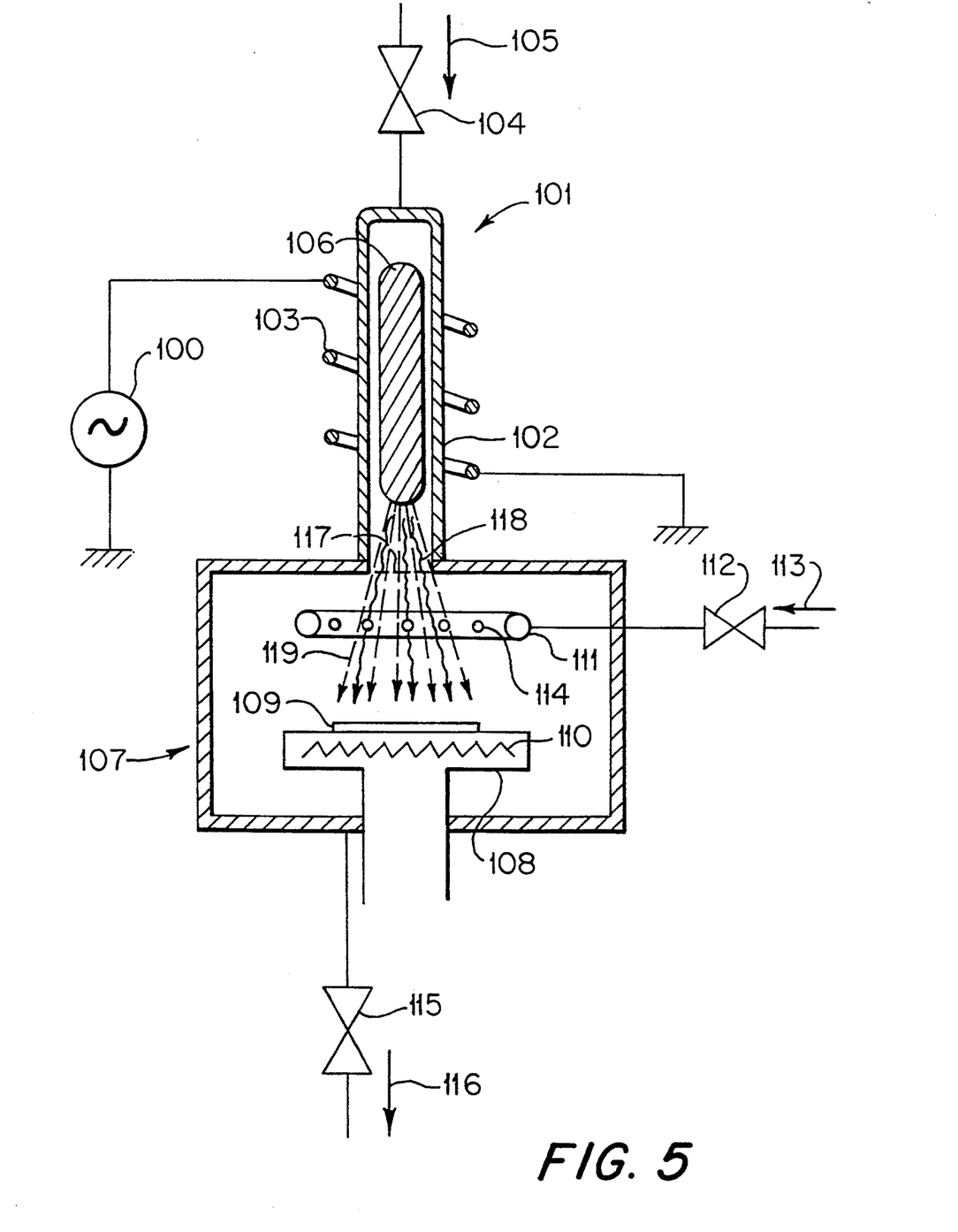
FIGS. 5, 6, 7 and 8 are schematic diagrams of surface processing apparatuses, respectively, which are suitable in use for performing the present invention.
Figure 6:
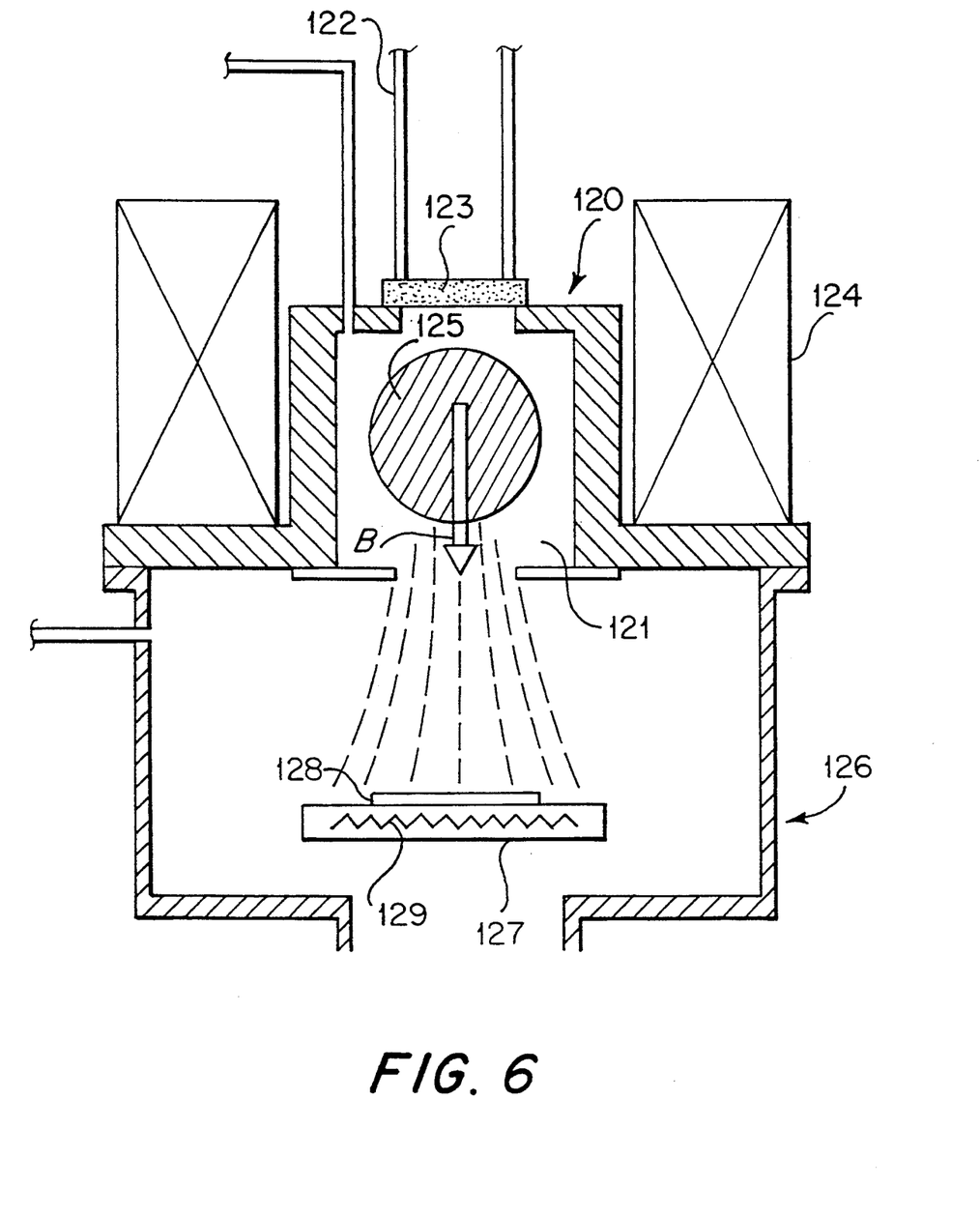
Figure 7:
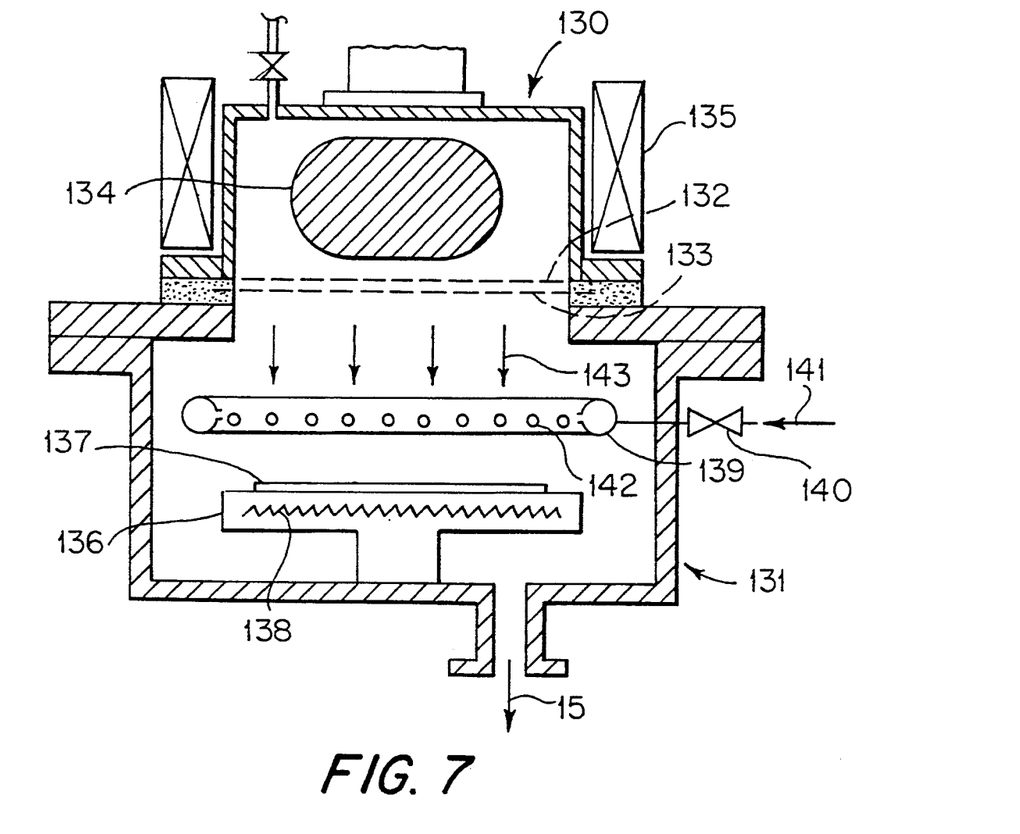

FIGS. 5 to 7 show such apparatuses as disclosed in U.S. Pat. No. 4,664,747.

In FIG. 5, reference number 100 shows an RF power source, 101 a discharge chamber, 102 a discharge tube, 103 a coil, 104 a valve, 105 a direction along which a discharge gas is introduced via the valve into the discharge tube 102, 106 a plasma generated in the discharge tube 102, 107 a reaction chamber, 108 a substrate holder for mounting a substrate or object to be treated 109 thereon, 110 a temperature controller, 111 a hollow conducting ring provided in the reaction chamber 107 for conducting thereinto reaction gas via a valve 112 in a direction 113, 114 through-holes bored in the ring 111, 115 a valve through which the conducted gas in the reaction chamber 107 is exhausted in a direction 116, 117 a mesh-shaped electrode provided for conducting active species 118 produced from plasma 106 to the surface of the substrate 109, and 119 the radiation conducted to the surface of the substrate 109.

In FIG. 6, reference numeral 120 shows a discharge chamber, 121 a cavity resonator to which microwave power is supplied via a waveguide 122 and a microwave conducting window 123, 124 an electromagnetic coil for generating a magnetic field in the cavity resonator 121, 125 a plasma, 126 a reaction chamber, 127 a substrate holder for mounting a substrate or an object to be treated 128, and 129 a temperature controller. The active species produced by the plasma 125 cascades on the substrate after being accelerated in the diverging portion of the magnetic field "B".

In FIG. 7, reference numeral 130 shows a discharge chamber, 131 a reaction chamber, 132 and 133 shielding light-grids provided in a region between the discharge chamber 130 and the reaction chamber 131, 134 a plasma, 135 an electromagnetic coil for generating a magnetic field in the discharge chamber 130,136 a substrate holder for mounting a substrate or an object to be treated 137, 138 a temperature controller, 139 a hollow conducting ring provided in the reaction chamber 131 for conducting thereinto reaction gas via a valve 140 in a direction 141, 142 through-holes bored in the ring 139, and 143 an activated core or active species of the plasma 134 passing through the shielding light-grids 132 and 133. The active species 143 are conducted to the surface of the substrate 1 137.

Figure 8:
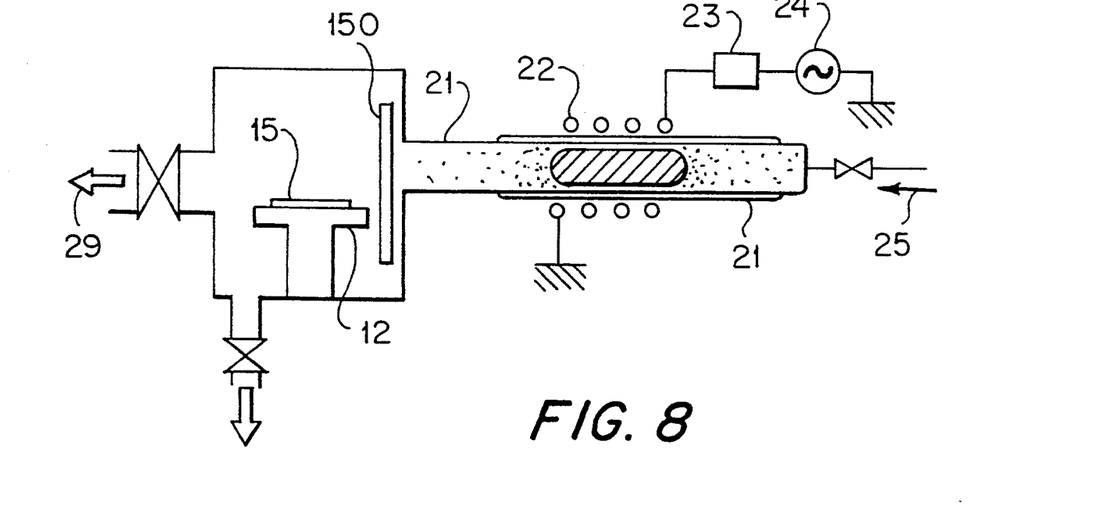

FIG. 8 shows another example of an apparatus suitable in use for performing the present invention. The apparatus, basically, has substantially the same construction as that of the apparatus shown in FIG. 2 and, accordingly, the constructional members or parts corresponding to those shown in FIG. 2 are illustrated by the same reference numerals as those used in FIG. 2. In FIG. 8, reference numeral 150 shows a quartz plate provided in the treatment chamber 11 at the outlet of the discharge tube 21. This wall-like plate prevents the plasma from directly bombarding the surface of the substrate 15. In this construction, the active species are conducted to the surface of the substrate.

While oxygen was used as a gas for oxidation, namely a gas for generation of active species, the use of ozone or nitrous oxide can be expected to be effective as well.

The foregoing treatment conditions such as the pressure of 0.7 Torr, the oxygen flow rate of 200 sccm, the substrate temperature, the supplied electric power, and the structure of the apparatus are merely preferred ones, which, therefore, should not be construed as limiting the scope of the present invention.

When the effect of a plasma as the source of active oxygen species is utilized, a bias voltage such as a DC, AC or RF voltage may be applied to the object holder 12.

As described hereinbefore, the method of the present invention is characterized in that an oxide superconductor (already having some superconducting properties) or a starting material of oxide superconductor (having potential of a superconductor in terms of the composition thereof but no superconducting properties yet) is irradiated with active species formed by a nonequilibrium or equilibrium, high-temperature plasma to improve the superconducting properties of the former or to impart superior superconducting properties to the latter. Accordingly, various apparatus structures in combination of various conditions are usable in carrying out the method of the present invention.

As described hereinbefore, the method of the present invention is capable of forming a good oxide superconductor from an oxide superconductor. or a starting material of oxide superconductor in a very short time through oxidation thereof with active oxygen species formed by a nonequilibrium or equilibrium, high-temperature plasma.

We claim:

1. A method of producing a final oxide superconductor, comprising the steps of:

mounting an object material of an initial oxide superconductor or a starting material of the initial oxide superconductor to an object holder;

maintaining said object material separate from a locally pinched plasma in a space surrounded by an electrode;

irradiating said object material with active oxygen species formed from said pinched plasma to change the structure of said object material to orthorhombic;

wherein said pinched plasma is defined by an emission spectrum for at least one oxygen (O) atom, which has an emission intensity substantially greater than the largest emission intensity in the visible spectra for oxygen ($O_2^+$) molecules observed for said pinched plasma.

2. A method as claimed in claim 1, wherein while said object material is being irradiated, said method further comprising the step of:

controlling the temperature of said object holder between approximately 300° C. to 450° C. to maintain said object material at a temperature at which it is effectively oxidized with said active oxygen species.

3. A method as claimed in claim 1, wherein said irradiating step comprises the step of:

irradiating said object material with said pinched plasma not more than five minutes.

4. A method as claimed in claim 1, further comprising the step of:

selecting said object material to have a composition $Ba_2YCu_3O_x$, where x is the quantitative proportion of oxygen in said composition.

5. A method as claimed in claim 1, further comprising the step of:

providing a power to an rf coil electrode to generate said locally pinched plasma.

6. A method as claimed in claim 1, wherein said pinched plasma is generated with an rf input power of 3 kW under a pressure of 0.7 Torr.

7. A method as claimed in claim 1, further comprising the step of:

causing said O atoms to undergo an energy level transition from $3p^5P$ to $3s^5S^0$ to effect said emission spectrum.

8. A method as claimed in claim 1, wherein the plasma emission of the oxygen (O) atoms has an intensity, at 777 nm-wavelength, of approximately 100 times stronger than the strongest emission intensity observed for said pinched plasma in the visible spectra of said oxygen ($O_2^+$) molecules.

9. A method of producing a final oxide superconductor, comprising the steps of:

mounting an object material of an initial oxide superconductor or starting material of the initial superconductor to an object holder;

maintaining said object material separate from a plasma whose emission is substantially confined in a space surrounded by an electrode;

irradiating said object material with active oxygen species formed from said plasma to change the structure of said object material to orthorhombic, said plasma being defined by an emission spectrum for oxygen (O) atoms which has an emission intensity substantially greater than the largest emission intensity in the visible spectra for oxygen ($O_2^+$) molecules observed for said plasma.

10. The method as claimed in claim 9, wherein while said object material is being irradiated, said method further comprising the step of:

controlling the temperature of said object holder between approximately 300° C. to 450° C. to maintain said object material at a temperature at which it is effectively oxidized with said active oxygen species.

11. The method as claimed in claim 9, wherein said irradiating step comprises the step of:

irradiating said object material with said substantially confined plasma not more than five minutes.

12. The method as claimed in claim 9, further comprising the step of:

selecting said object material to have a composition $Ba_2YCu_3O_x$, where x is the quantitative proportion of oxygen in said composition.

13. The method as claimed in claim 9, further comprising the step of:

providing a power to said electrode to generate said substantially confined plasma, said electrode being an rf coil electrode.

14. The method as claimed in claim 13, wherein said substantially confined plasma is generated with an rf input power of 3 kW under a pressure of 0.7 Torr.

15. The method of as claimed in claim 9, further comprising the step of:

causing said O atom to undergo an energy level transition from $3p^5P$ to $3s^5S^0$ to effect said emission spectrum.

16. The method as claimed in claim 9, wherein said emission intensity of said O atoms are further defined to be, at the emission of said O atoms at 777 nm-wavelength, approximately, at least, 100 times greater than the largest emission intensity observed for said substantially confined plasma in the visible spectra for said $O_2^+$ molecules.

* * * * *